(12) United States Patent
Lee et al.

(10) Patent No.: US 11,315,964 B2
(45) Date of Patent: Apr. 26, 2022

(54) OPTICAL SENSORS AND METHODS FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Jiunn-Liang Yu, Taipei (TW); Kwang-Ming Lin, Taichung (TW); Yin Chen, Hsinchu (TW); Si-Twan Chen, Jhubei (TW); Hsueh-Jung Lin, Jhubei (TW); Wen-Chih Lu, New Taipei (TW); Ting-Jung Lu, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 34 days.

(21) Appl. No.: 16/265,084

(22) Filed: Feb. 1, 2019

(65) Prior Publication Data

US 2020/0251506 A1  Aug. 6, 2020

(51) Int. Cl.
*H01L 27/144* (2006.01)
*H01L 31/18* (2006.01)
*H01L 31/0232* (2014.01)
*H01L 31/0216* (2014.01)

(52) U.S. Cl.
CPC .... *H01L 27/1446* (2013.01); *H01L 31/02164* (2013.01); *H01L 31/02327* (2013.01); *H01L 31/18* (2013.01)

(58) Field of Classification Search
CPC ......... H01L 31/02164; H01L 27/14623; H01L 27/14643
See application file for complete search history.

(56) References Cited

U.S. PATENT DOCUMENTS

| | | | |
|---|---|---|---|
| 2006/0138495 A1* | 6/2006 | Li | H01L 27/14625 257/292 |
| 2010/0171226 A1 | 7/2010 | West et al. | |
| 2014/0183342 A1 | 7/2014 | Shedletsky et al. | |
| 2016/0224816 A1 | 8/2016 | Smith et al. | |

(Continued)

FOREIGN PATENT DOCUMENTS

TW    201445716 A    12/2014

OTHER PUBLICATIONS

Taiwanese Office Action and Search Report dated Aug. 13, 2019, for Taiwanese Application No. 107133793.
(Continued)

*Primary Examiner* — Moazzam Hossain
*Assistant Examiner* — Hajar Kolahdouzan
(74) *Attorney, Agent, or Firm* — Birch, Stewart, Kolasch & Birch, LLP

(57) ABSTRACT

An optical sensor includes pixels disposed in a substrate. A light collimating layer is disposed on the substrate and includes a transparent layer, a light-shielding layer, and transparent pillars. The transparent layer blanketly disposed on the substrate covers the pixels and the region between the pixels. The light-shielding layer is disposed on the transparent layer and between the transparent pillars. The transparent pillars penetrating through the light-shielding layer are correspondingly disposed on the pixels.

16 Claims, 9 Drawing Sheets

(56) References Cited

U.S. PATENT DOCUMENTS

2017/0038669 A1* 2/2017 Bierhuizen ............ G03B 37/04
2017/0220844 A1 8/2017 Jones et al.
2018/0373945 A1* 12/2018 Wu ........................ G06V 40/70

OTHER PUBLICATIONS

Taiwanese Office Action and Search Report dated May 10, 2019 for Application No. 107133793.
Taiwanese Office Action and Search Report, dated Apr. 27, 2020, for Taiwanese Application No. 107133793.

* cited by examiner

OPTICAL SENSORS AND METHODS FOR FORMING THE SAME

BACKGROUND

Technical Field

The disclosure relates to optical elements, and more particularly, to optical sensors and methods for forming the same.

Description of the Related Art

Optical elements of an optical sensor can include a light collimator, a beam splitter, a focus lens, and a linear sensor. The function of the light collimator is to collimate light to reduce power loss caused by light divergence. For example, the light collimator may be applied to optical sensors to increase the efficiency of fingerprint recognition devices.

The light collimator includes transparent pillars and a light-shielding layer surrounding the transparent pillars to achieve the effect of collimating light. When the transparent pillars are required to have a high aspect ratio due to design demands, the process capability limitation may easily cause the deformation and collapse of the transparent pillars, thereby affecting the yield of the optical sensors.

Although existing optical sensors have been generally adequate for their intended purposes, they have not been entirely satisfactory in all respects. In particular, increasing the aspect ratio of the light collimator still needs further improvement.

SUMMARY

Some embodiments of the present disclosure provide an optical sensor. The optical sensor includes pixels disposed in a substrate and a light collimating layer disposed on the substrate. The light collimating layer includes a transparent layer blanketly disposed on the substrate, covering the pixels and a region between the pixels; a light-shielding layer disposed over the transparent layer; and transparent pillars through the light-shielding layer, correspondingly disposed on the pixels.

Some embodiments of the present disclosure provide a method for forming an optical sensor. The method includes forming pixels in a substrate and forming a light collimating layer on the substrate. Forming the light collimating layer includes blanketly forming a transparent layer on the substrate, covering the pixels and a region between the pixels; forming transparent pillars on the transparent layer, wherein the transparent pillars are correspondingly disposed on the pixels; and planarizing upper surfaces of the transparent pillars and the light-shielding layer.

In order to make the purposes, features and advantages of the present disclosure easy to understand, a detailed description is given in the following embodiments with reference to the accompanying drawings.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
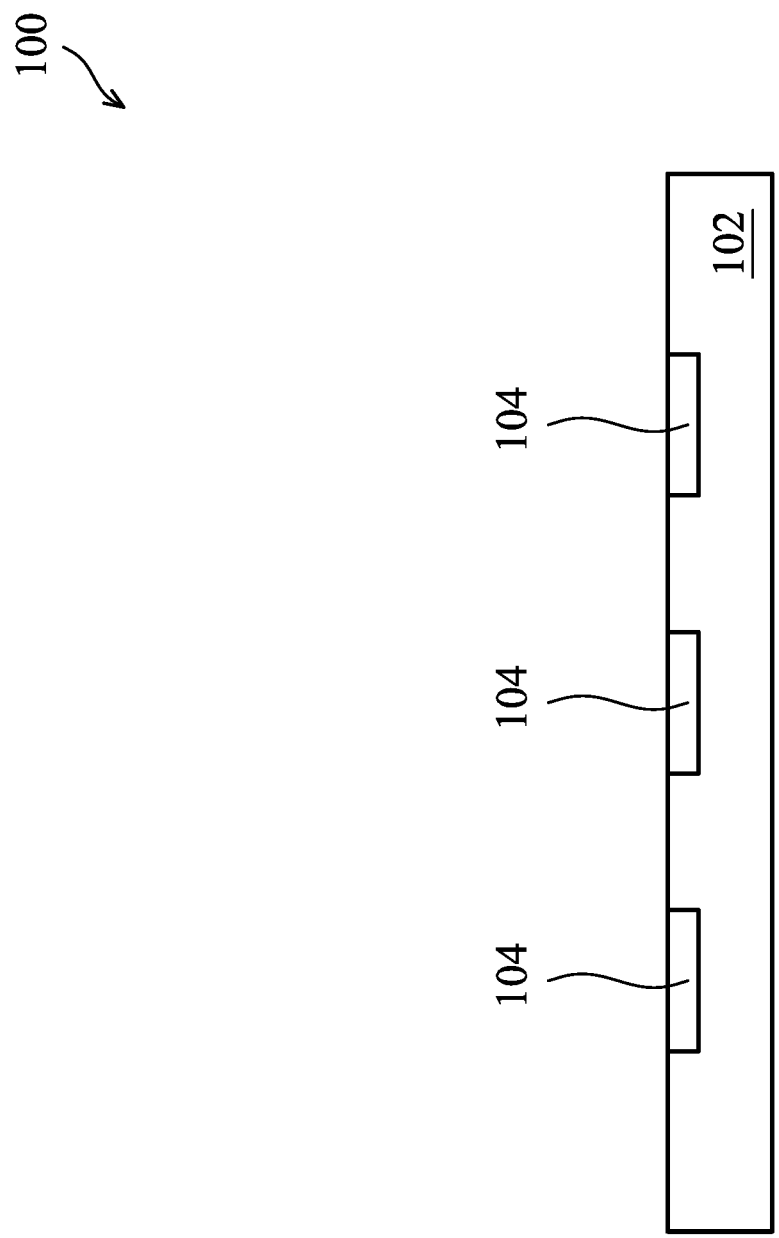
FIGS. 1-4 illustrate cross-sectional views of forming an optical sensor at various stages in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the optical sensor in the present disclosure. Some of the features described below can be replaced or eliminated for different embodiments.

The embodiments of the present disclosure provide an optical sensor. By blanketly disposing a transparent layer below transparent pillars and between pixels, the process capability limitation can be avoided to increase the total aspect ratio of the transparent portion of the light collimating layer. Moreover, by modifying the shape and size of the transparent pixels in a cross-sectional view to meet design demands, the light is vertically incident to the transparent layer, which can prevent the light from escaping and increase the process yield.

FIGS. 1-4 illustrate cross-sectional views of forming an optical sensor 100 at various stages in accordance with some embodiments of the present disclosure. As shown in FIG. 1, a substrate 102 is provided. The substrate 102 may be a semiconductor substrate, such as a silicon substrate. In addition, the semiconductor substrate may also be elementary semiconductors including germanium; compound semiconductors including gallium nitride (GaN), silicon carbide (SiC), gallium arsenide (GaAs), gallium phosphide (GaP), indium phosphide (InP), indium arsenide (InAs), and/or indium antimonide (InSb); alloy semiconductors including SiGe alloy, GaAsP alloy, AlInAs alloy, AlGaAs alloy, GaInAs alloy, GaInP alloy, and/or GaInAsP alloy; or a combination thereof. In some embodiments, the substrate 102 may also be a semiconductor on insulator (SOI) substrate, which may include a substrate, a buried oxide layer disposed on the substrate, or a semiconductor layer disposed on the buried oxide layer. In addition, the substrate 102 may have an n-type or p-type conductivity type.

In some embodiments, the substrate 102 may include various isolation features (not shown) which are used to define active regions in/on the substrate 102 and to isolate them active regions. In some embodiments, the isolation features may include shallow trench isolation (STI) features, local oxidation of silicon (LOCOS) features, other suitable isolation features, or a combination thereof. In some embodiments, the formation of the isolation features may include, for example, forming an insulating layer on the substrate 102, selectively etching the insulating layer and the substrate 102 to form trenches in the substrate 102, growing a nitrogen-rich lining layer (such as silicon oxynitride) in the trenches, filling the insulating material in the trenches (such as silicon dioxide, silicon nitride, or silicon oxynitride) by a deposition process, performing an annealing process on the insulating material in the trenches, performing a planarization process such as a chemical mechanical polishing (CMP) on the substrate 102 to remove the excess insulating material so that the top surfaces of the insulating material in the trenches and the substrate 102 are coplanar.

In some embodiments, the substrate 102 may include various p-type doped regions and/or n-type doped regions (not shown) formed by ion implantation and/or diffusion processes. In some embodiments, doped regions may form transistors, photodiodes and so on. However, the above elements are merely an example and the present disclosure is not limited thereto.

In some embodiments, the substrate 102 may include various conductive features, such as conductive lines or vias (not shown). For example, the above conductive features may be made of aluminum (Al), copper (Cu), tungsten (W), other suitable conductive materials, an alloy thereof, or a combination thereof.

In some embodiments, the substrate 102 may include pixels 104 therein, as shown in FIG. 1. The pixels 104 may include optical sensors. The optical sensor may include a photodiode, a charge coupling device (CCD) sensors, a complementary metal-oxide-semiconductor (CMOS) image sensor, an active sensor, a passive sensor, other suitable sensors, or a combination thereof. In some embodiments, a single pixel 104 may correspond to at least a single optical sensor, such as at least a single photodiode. In addition, the optical sensor may be connected to a read-out circuit (not shown). The read-out circuit may include a transfer transistor, a reset transistor, a source-follower transistor, a select transistor, other one or more suitable transistor(s), or a combination thereof. The pixels 104 may convert a received optical signal into an electronic signal by the optical sensor and read the electronic signal by the read-out circuit. It is worth noting that only a portion of the pixels 104 is illustrated in FIG. 1, but the actual number of the pixels 104 is not limited thereto. In some embodiments, the pixels 104 are arranged in an array in the substrate 102.

Figure 2:
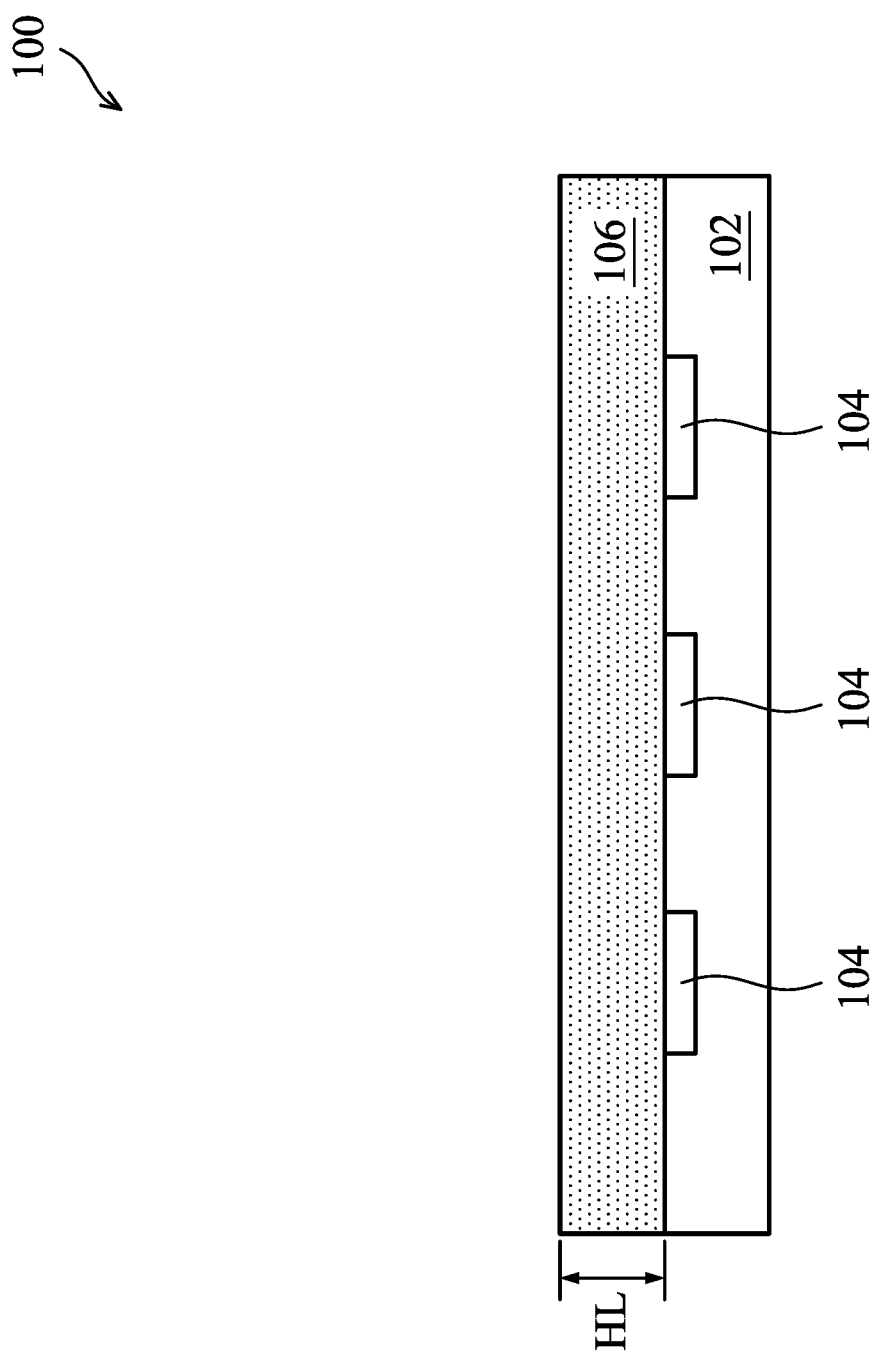

Next, a transparent layer 106 is blanketly formed on the substrate 102, as shown in FIG. 2. In some embodiments, the transparent layer 106 may include a transparent material having a transmittance of greater than 60% for the light having a wavelength from 300 nm to 1100 nm. The transparent material may include a photocuring material, a thermosetting material, or a combination thereof. In some embodiments, the transparent material may include, for example, polymethylmethacrylate (PMMA), perfluorocyclobutyl (PFCB) polymer, polyimide, epoxy resin, other suitable materials, or a combination thereof. In some embodiments, the transparent material may be deposited on the substrate 102 by a spin coating, a chemical vapor deposition, a casting, a roller casting, a blade coating, a wire coating, a dip coating, other suitable methods, or a combination thereof.

In some embodiments, the transparent layer 106 has a height HL that is between 30 µm and 500 µm. If the height HL of the transparent layer 106 is too high, the incident light from above easily escapes to areas outside the pixels 104. If the height HL of the transparent layer 106 is too low, it is difficult to make an overall transparent portion formed subsequently have a high aspect ratio.

Figure 3:
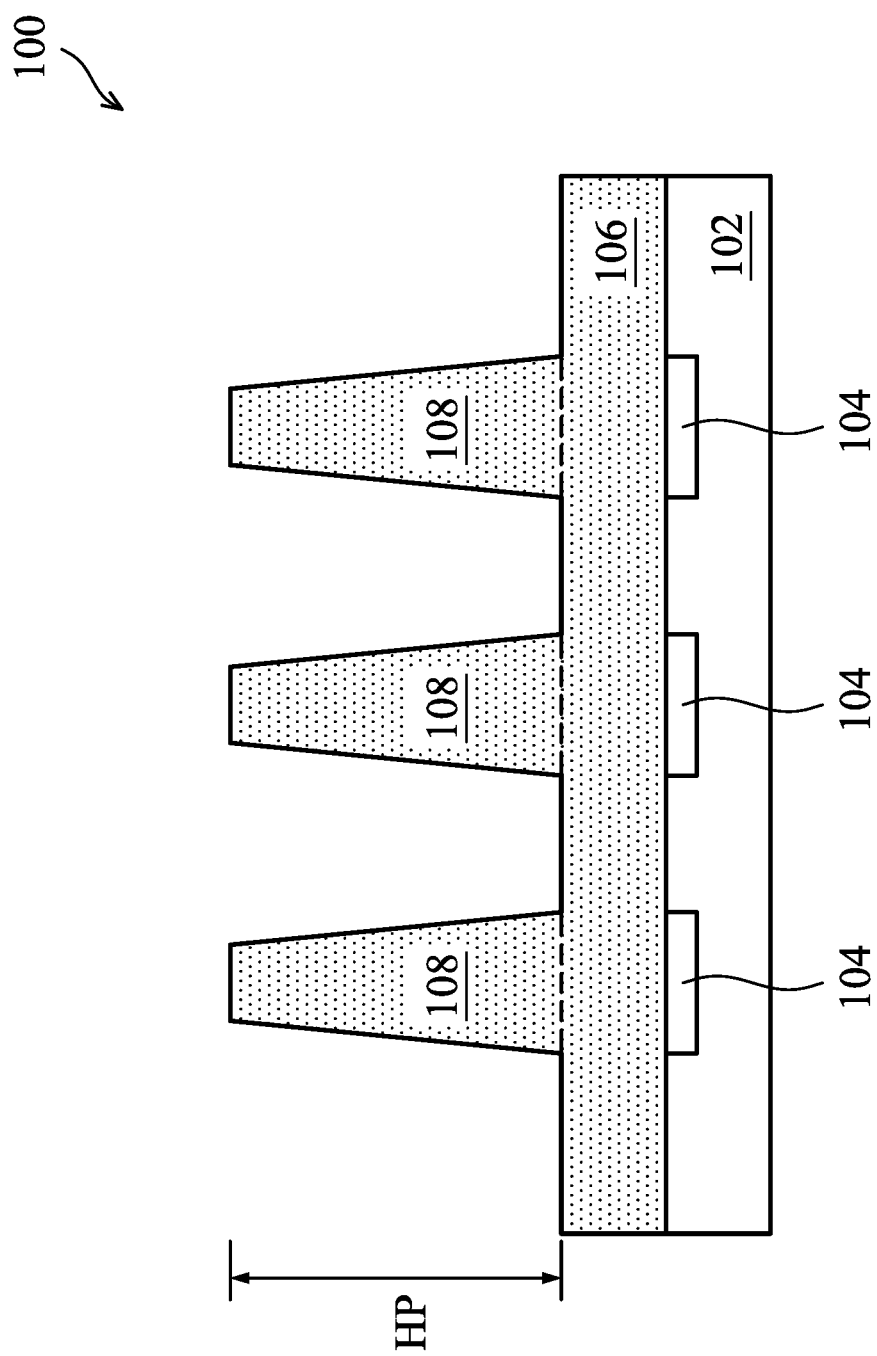

Next, transparent pillars 108 are formed on the transparent layer 106. In some embodiments, a transparent material (not shown) may be first blanketly formed on the transparent layer 106. In some embodiments, the material for forming the transparent pillars 108 may be the same as or similar to that of the transparent layer 106 described above and is not repeated herein. In some other embodiments, the material of the transparent pillars 108 is different from that of the transparent layer 106, depending on process demands. In FIG. 3, since the transparent pillars 108 and the transparent layer 106 use the same transparent material, there may be no obvious interface therebetween and the boundary of the two is indicated by a broken line.

Next, the transparent material on the transparent layer 106 is selectively removed. In some embodiments, if the transparent material is not photoresist material, the transparent material may be selectively removed by a photolithography process and an etching process to form the transparent pillars 108 on the transparent layer 106 over the pixels 104 correspondingly. In some embodiments, the photolithography process may include photoresist coating (e.g., spin-on coating), soft baking, mask aligning, pattern exposure, post-exposure baking, development, rinsing, and drying (e.g., hard baking), other suitable techniques, or a combination thereof. The etching process may include a dry etching process (e.g., reactive ion etch (RIE), plasma etching, or ion milling), a wet etching process, or a combination thereof. In some other embodiments where the transparent material is a photoresist material, the transparent pillars 108 may be directly formed by curing the transparent material using a curing process such as a photocuring process and then cleaning the unexposed portion. The shape of the transparent pillars 108 in the cross-sectional view may be modified by a focal length of exposure in the patterning process. For example, the transparent pillar 108 may be an upwardly tapered trapezoid in the cross-sectional view, as shown in FIG. 3. In some other embodiments, the transparent pillar 108 may be other shapes in the cross-sectional view, for example, a downwardly tapered inverted trapezoid, a rectangle, a nonlinear-sidewall pattern, other suitable shapes, or a combination thereof.

In some other embodiments, the transparent pillar 108 has a height HP that is between 30 µm and 500 µm. If the height HP of the transparent pillar 108 is too high, the transparent pillar 108 is easily deformed and collapsed. If the height HP of the transparent pillar 108 is too low, it is insufficient to make the light from above vertically incident to the transparent layer 106 so that the light may escape to regions outside of the pixels 104.

Figure 4:
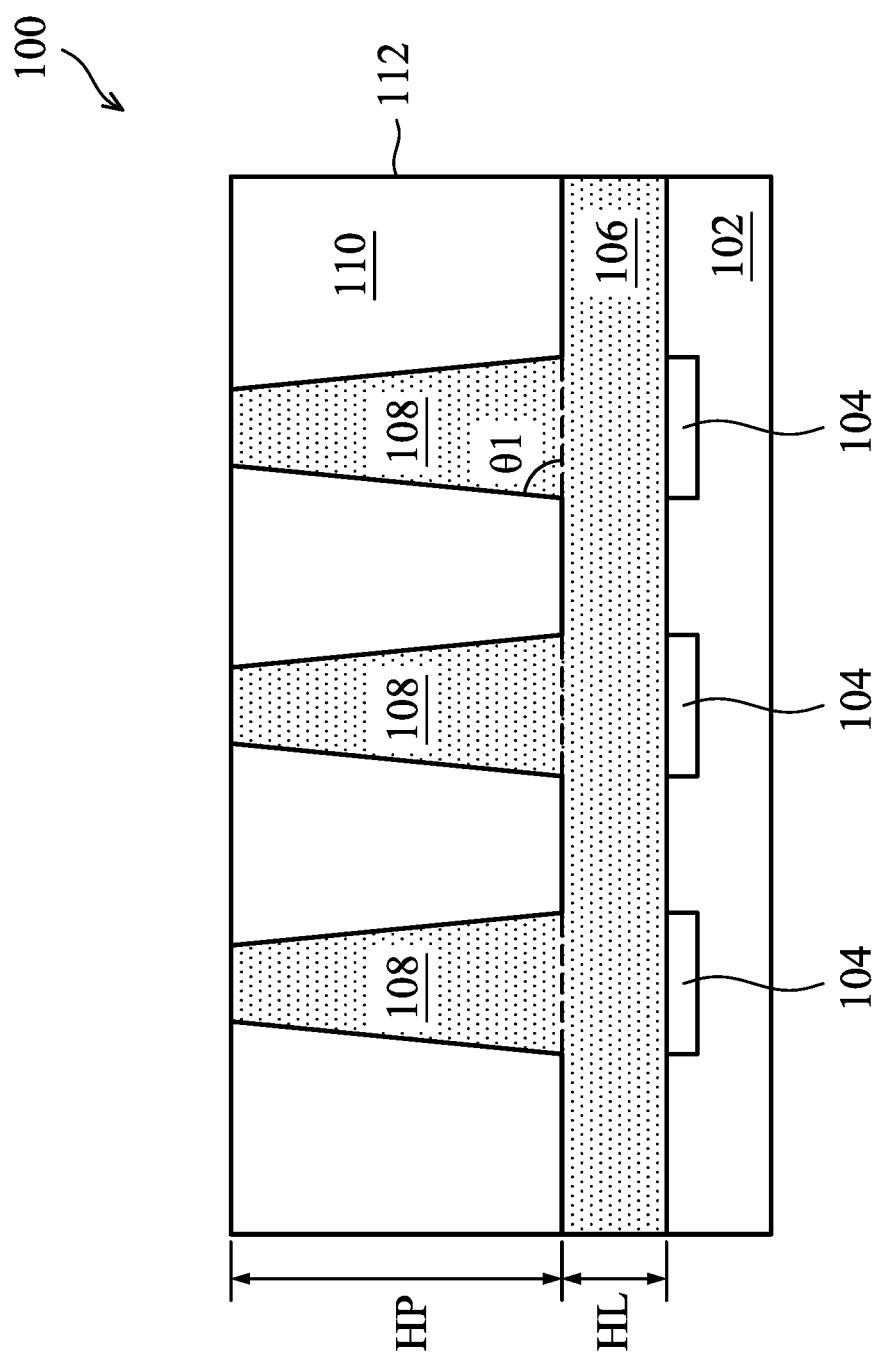

Next, a light-shielding layer 110 is formed between the transparent pillars 108 over the transparent layer 106, as shown in FIG. 4. In some embodiments, the light-shielding layer 110 may include a light-shielding material having an absorptivity of more than 90% for the light having a wavelength from 350 nm to 1100 nm. The light-shielding material may include photocuring material, thermal curing material, or a combination thereof. In some embodiments, the light-shielding material includes a non-transparent photoresist, an ink, a molding compound, a solder mask, other suitable materials, or a combination thereof. In some embodiments, the light-shielding material may be disposed between the transparent pillars 108 over the transparent layer 106. Then, the light-shielding material is cured by performing a curing process such as a photocuring process, a thermal curing process, or a combination thereof to form the light-shielding layer 110. In some embodiments, the light-shielding layer 110 is formed using a single light-shielding material, and thus the process is simplified and the mass production time and cost are reduced.

Next, a planarization process such as chemical mechanical polishing process is performed on the transparent pillars 108 and the light-shielding layer 110 to remove the excess light-shielding material so that the top surfaces of the transparent pillars 108 and the light-shielding layer 110 are coplanar. As a result, a light collimating layer 112 including the transparent layer 106, the transparent pillars 108 and the light-shielding layer 110 is formed.

As shown in FIG. 4, the aspect ratio of the transparent portion of the light collimating layer 112 may be increased by forming the transparent layer 106 and transparent pillars 108 respectively to prevent the deformation and collapse of the transparent pillars 108 due to their heights being too high during a single process. For example, in some embodiments, the ratio of the sum of the height HP of the transparent pillar 108 and the height HL of the transparent layer 106 to the average width of the transparent pillars 108 is between 1 and 50.

In some embodiments, the shape and height of the transparent pillars 108 in the cross-sectional view may be modified so that the incident light from above is vertically incident to transparent layer 106. As a result, the incident light can be prevented from escaping to regions outside of the pixels 104.

In some embodiment, the ratio of the diameter of the transparent pillar 108 to the height of the transparent layer 106 is between 1 and 50. If the ratio of the diameter of the transparent pillar 108 to the height of the transparent layer 106 is too high, the transparent pillars 108 are easily deformed and may collapse due to the transparent pillars 108 being too high. If the ratio of the diameter of the transparent pillar 108 to the height of the transparent layer 106 is too low, the light from above may easily escape to regions outside of the pixels 104.

In addition, in some embodiments, the transparent pillars 108 are upwardly tapered trapezoids of the same size in the cross-sectional view, as shown in FIG. 4. The area of the bottom surface of the transparent pillar 108 is greater than the area of the top surface of the transparent pillar 108. As a result, the light-shielding layer 110 is easily formed between the transparent pillars 108 thereby preventing the formation of gaps between the transparent pillars 108 and the light-shielding layer 110 and reducing the collimating effect.

In some embodiments, the angle $\theta 1$ between the sidewall and the bottom surface of the transparent pillar 108 is between 30° and 89°. If $\theta 1$ is too large, the collimating effect may be reduced due to difficulty in filling the light shielding layer 110. If $\theta 1$ is too small, the amount of light absorbed by the underlying pixels 104 may be decreased due to the transparent area being too small.

In some embodiments, the optical sensor 100 may include other optical elements over the collimating layer 112, such as color filters, glass, or microlenses (not shown). The incident light passes through the optical elements above the collimating layer 112 and through the transparent pillars 108 and transparent layer 106 to illuminate the pixels 104. In some embodiments, the transparent pillar 108 is located directly over the pixel 104. As a result, the amount of light illuminating the pixels 104 may be increased.

As described above, the total aspect ratio of the transparent portion of the collimating layer of the optical sensor can be increased by forming the transparent layer and transparent pillars of the transparent portion respectively to prevent the deformation and collapse of the transparent pillars due to their heights being too high. Moreover, the incident light from above can be vertically incident to the transparent layer by modifying the shape and size of the transparent pillars in the cross-sectional view to prevent the light from escaping to areas outside the pixels. Furthermore, the light-shielding layer is easily formed between the transparent pillars by forming transparent pillars with an area of the bottom surface that is greater than the area of the top surface to prevent the formation of gaps between the transparent pillars and the light-shielding layer, thereby improving the collimating effect and increasing the yield.

Figure 5:
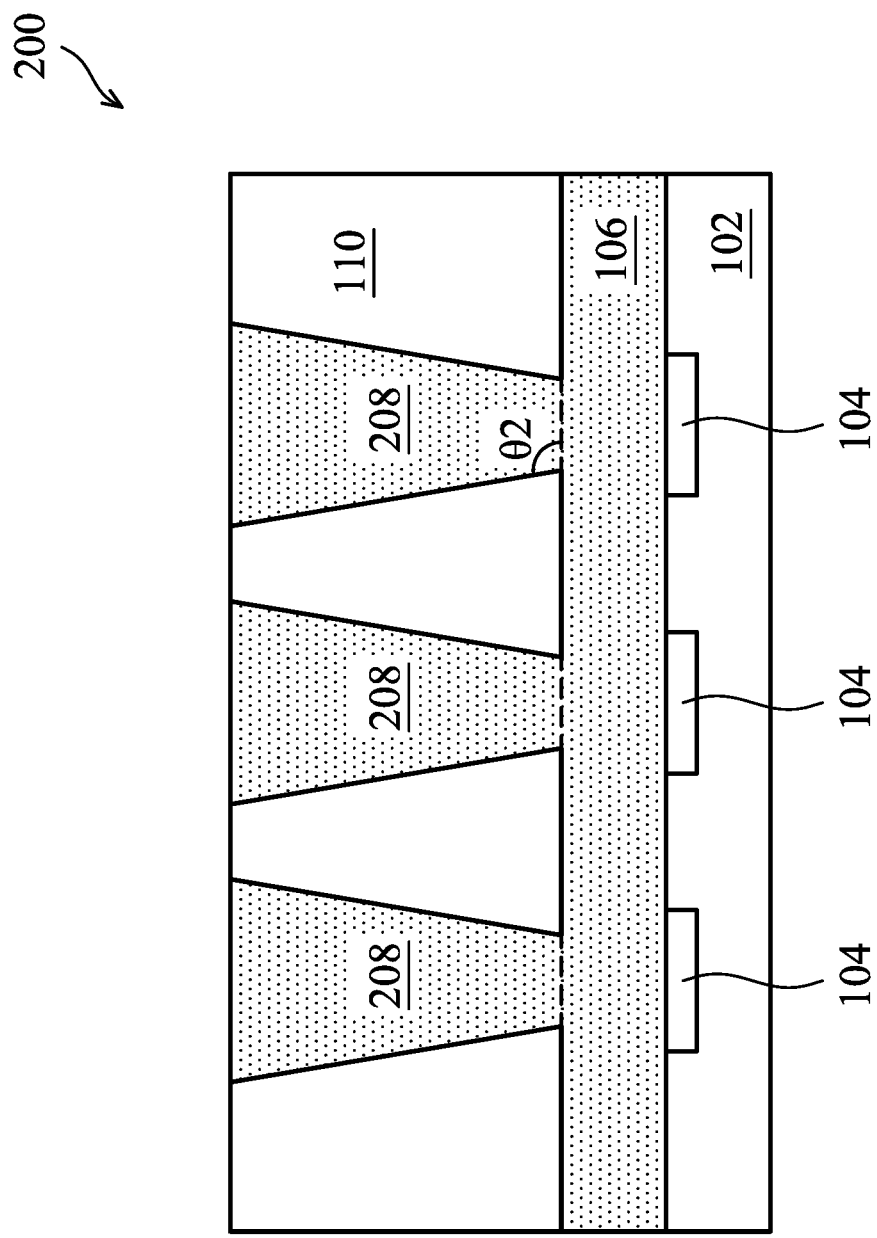
FIG. 5 is a cross-sectional view of an optical sensor in accordance with some other embodiments of the present disclosure.

FIG. 5 is a cross-sectional view of an optical sensor 200 in accordance with some other embodiments of the present disclosure, wherein elements and processes that are the same or similar to those described above are denoted by the same numerals and the description thereof will not be repeated. The difference from the embodiments described above is that transparent pillar 208 is a downwardly tapered inverted trapezoid, as shown in FIG. 5. By forming the transparent pillars 208 and the transparent layer 106 respectively, the deformation and collapse of the transparent pillars 208 due to their heights being too high can be prevented during a single process. In some embodiments, the shape and the height of the transparent pillar 208 in the cross-sectional view may be modified by a focal length of exposure in the patterning process so that the incident light from above is vertically incident to the transparent layer 106. As a result, it is possible to prevent the incident light from escaping to areas outside the pixels 104. The transparent pillar 208 is a downwardly tapered inverted trapezoid, which may increase the process yield.

In some embodiments, an angle θ2 between the sidewall and the bottom surface of the transparent pillar 208 is between 90° and 150°. If θ2 is too large, the amount of light absorbed by the underlying pixels 104 may be decreased due to the transparent area being too small. If θ2 is too small, the collimating effect may be reduced due to difficulty in filling the transparent layer 110.

In the embodiments as shown in FIG. 5, the total aspect ratio of the transparent portion of the collimating layer can be increased by forming the transparent layer and transparent pillars of the transparent portion respectively to prevent the deformation and collapse of the transparent pillars due to their heights being too high. Moreover, the incident light from above can be vertically incident to the transparent layer by modifying the shape and the size of the transparent pillars in the cross-sectional view to prevent the light from escaping to areas outside the pixels, thereby improving the collimating effect and increasing the yield.

Figure 6:
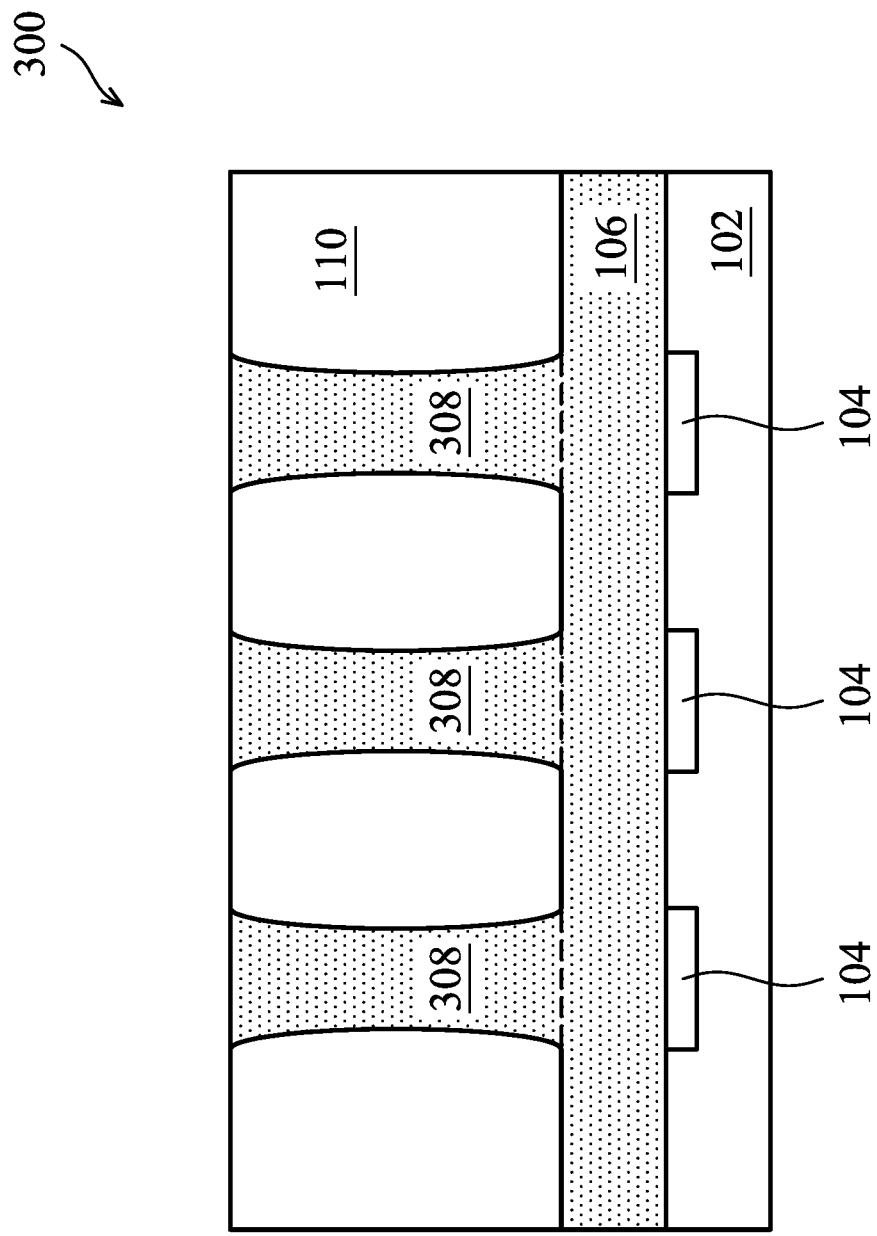
FIG. 6 is a cross-sectional view of an optical sensor in accordance with some other embodiments of the present disclosure.

FIG. 6 is a cross-sectional view of an optical sensor 300 in accordance with some other embodiments of the present disclosure, wherein elements and processes that are the same or similar to those described above are denoted by the same numerals and the description thereof will not be repeated. The difference from the embodiments described above is that transparent pillars 308 have nonlinear sidewalls, as shown in FIG. 6. For example, the transparent pillar 308 is a double concave shape in the cross-sectional view. By forming transparent pillars 308 and the transparent layer 106 respectively, it is possible to prevent the deformation and collapse of the transparent pillars 308 due to their heights being too high during a single process. In some embodiments, the shape and the height of the transparent pillar 308 in the cross-sectional view may be modified by a focal length of exposure in the patterning process so that the incident light from above is vertically incident to the transparent layer 106. As a result, it is possible to prevent the incident light from escaping to areas outside the pixels 104. The transparent pillar 308 having nonlinear sidewalls can increase the degree of freedom for modulating the incident light.

It is worth noting that the shape of the transparent pillar 308 in the cross-sectional view of FIG. 6 is merely an example, and the present disclosure is not limited thereto. For example, the non-linear sidewall of the transparent pillar 308 may be a hyperbolic surface, a curvature surface, a half-sphere-like surface, a necking surface, a notching surface, a facet surface, other non-linear surfaces, or a combination thereof, depending on process and design demands.

In the embodiments as shown in FIG. 6, the total aspect ratio of the transparent portion of the collimating layer of the optical sensor can be increased by forming the transparent layer and transparent pillars of the transparent portion respectively to prevent the deformation and collapse of the transparent pillars due to their heights being too high. Moreover, the incident light from above can be vertically incident to the transparent layer by modifying the shape and the size of the transparent pillars in the cross-sectional view to prevent the light from escaping to areas outside the pixels. Furthermore, the transparent pillar having nonlinear sidewalls can increase the degree of freedom for modulating the incident light, thereby improving the collimating effect and increasing the yield.

Figure 7:
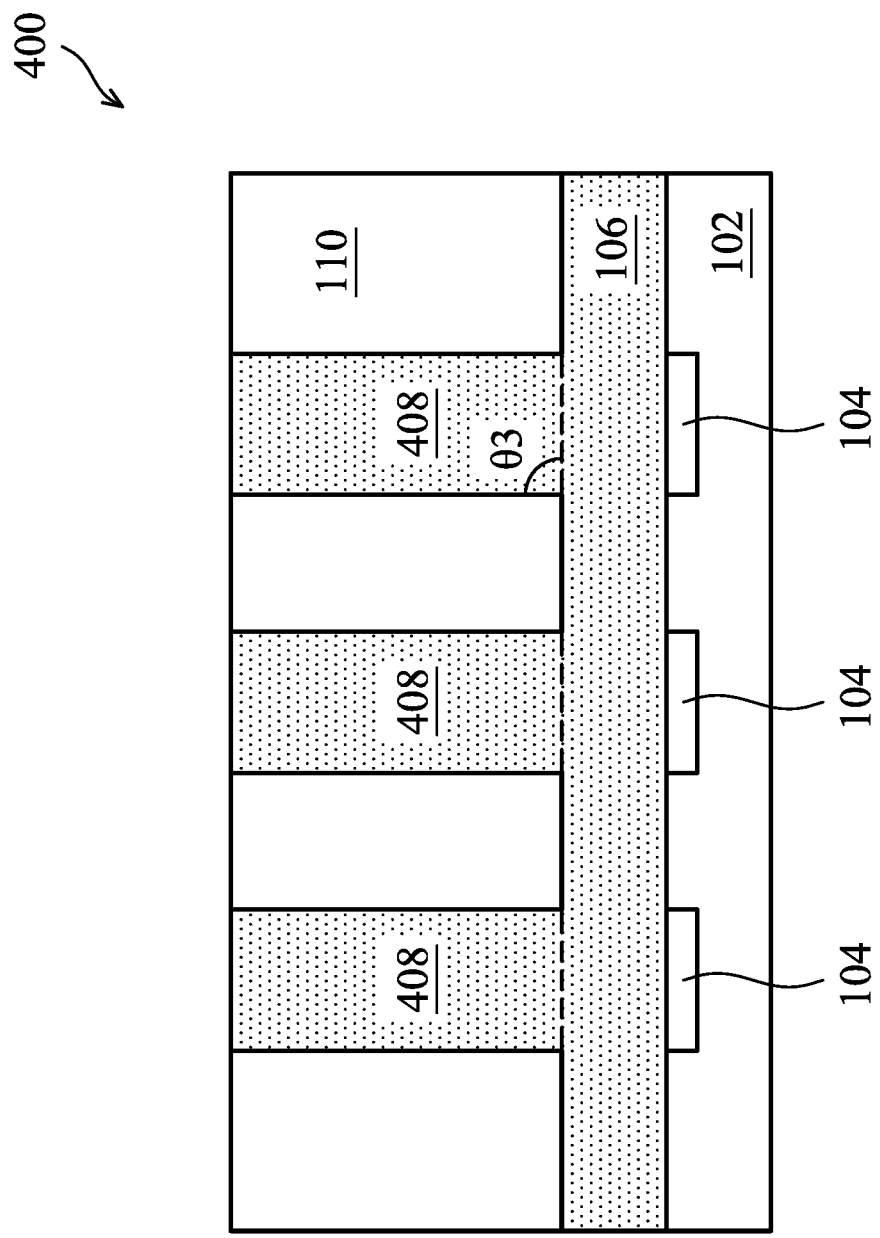
FIG. 7 is a cross-sectional view of an optical sensor in accordance with some other embodiments of the present disclosure.

FIG. 7 is a cross-sectional view of an optical sensor 400 in accordance with some other embodiments of the present disclosure, wherein elements and processes that are the same or similar to those described above are denoted by the same numerals and the description thereof will not be repeated. The difference from the embodiments described above is that the transparent pillars 408 have a rectangular shape in the cross-sectional view, as shown in FIG. 7. In some embodiments, the shape and height of the transparent pillar 408 in the cross-sectional view may be modified by a focal length of exposure in the patterning process so that the incident light from above is vertically incident to the transparent layer 106. As a result, it is possible to prevent the incident light from escaping to areas outside the pixels 104.

In some embodiments, an angle θ3 between the sidewall and the bottom surface of the transparent pillar 408 is 90°. That is, the sidewall of the transparent pillar 408 is perpendicular to its bottom surface. Moreover, the area of the bottom surface of the transparent pillar 408 is the same as the area of the top surface of the transparent pillar 408. As a result, the amount of light absorbed by the underlying pixels 104 can be increased.

In the embodiments as shown in FIG. 7, the total aspect ratio of the transparent portion of the collimating layer of the optical sensor can be increased by forming the transparent layer and transparent pillars of the transparent portion respectively to prevent the deformation and collapse of the transparent pillars due to their heights being too high. Moreover, the incident light from above can be vertically incident to the transparent layer by modifying the shape and the size of the transparent pillars in the cross-sectional view to prevent the light from escaping to areas outside the pixels. Furthermore, the transparent pillar having the area of the bottom surface that is the same as the area of the top surface of the transparent pillar can increase the amount of light absorbed by the underlying pixels, thereby improving the collimating effect and increasing the yield.

Figure 8:
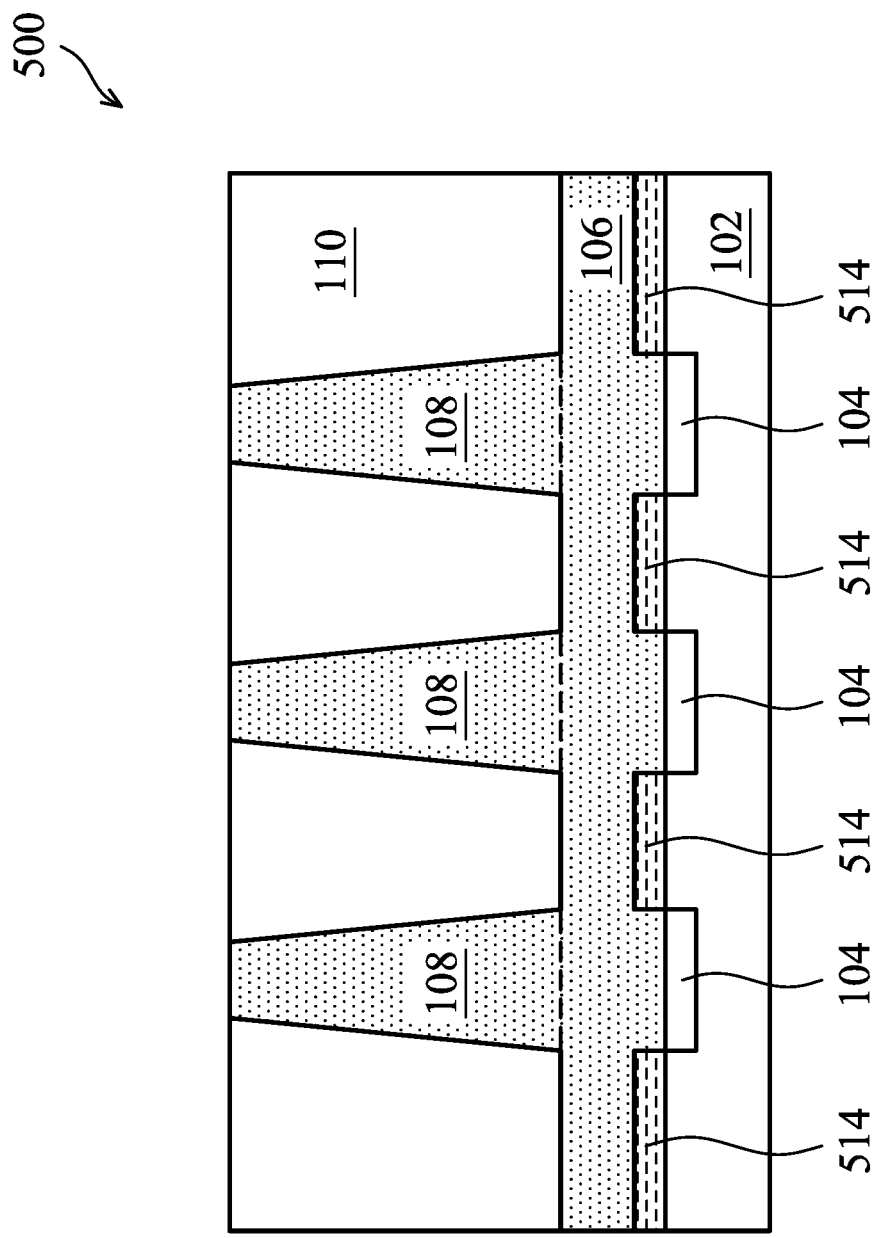
FIG. 8 is a cross-sectional view of an optical sensor in accordance with some other embodiments of the present disclosure.

FIG. 8 is a cross-sectional view of an optical sensor 500 in accordance with some other embodiments of the present disclosure, wherein elements and processes that are the same or similar to those described above are denoted by the same numerals and the description thereof will not be repeated. The difference from the embodiments described above is that the optical sensor 500 further includes a bottom light-shielding layer 514, as shown in FIG. 8. The bottom light-shielding layer 514 is located over the substrate 102 between the pixels 104, and the bottom light-shielding layer 514 is located below the transparent layer 106. In some embodiments, the material of the bottom light-shielding layer 514 is different from that of the subsequently formed light-shielding layer 110. In some embodiments, the bottom light-shielding layer 514 may include a photocuring material having an absorptivity of more than 90% for the light having a wavelength from 325 nm to 1100 nm. The photocuring material may include a non-transparent photosensitive resin, a carbon black, a black molding resin, a metal, other non-transparent materials, or a combination thereof. In some embodiments, the photocuring material may be disposed over substrate 102 and then a curing process such as a photocuring process may be performed to cure the photocuring material, and thus the bottom light-shielding layer 514 is formed over the substrate 102 between the pixels 104. In some embodiments, the bottom light-shielding layer 514 is located below the subsequently formed light-shielding layer 110.

In some embodiments, the bottom light-shielding layer 514 over the substrate 102 between the pixels 104 can prevent the light from entering regions of the substrate 102 where no pixel 104 and generating the noise of the optical signal.

In the embodiments as shown in FIG. 8, the total aspect ratio of the transparent portion of the collimating layer of the optical sensor can be increased by forming the transparent layer and transparent pillars of the transparent portion respectively to prevent the deformation and collapse of the transparent pillars due to their heights being too high. Moreover, the incident light from above can be vertically incident to the transparent layer by modifying the shape and the size of the transparent pillars in the cross-sectional view to prevent the light from escaping to areas outside the pixels. Furthermore, the noise of the optical signal can be decreased by forming the bottom light-shielding layer over the substrate between the pixels, thereby improving the collimating effect and increasing the yield.

Figure 9:
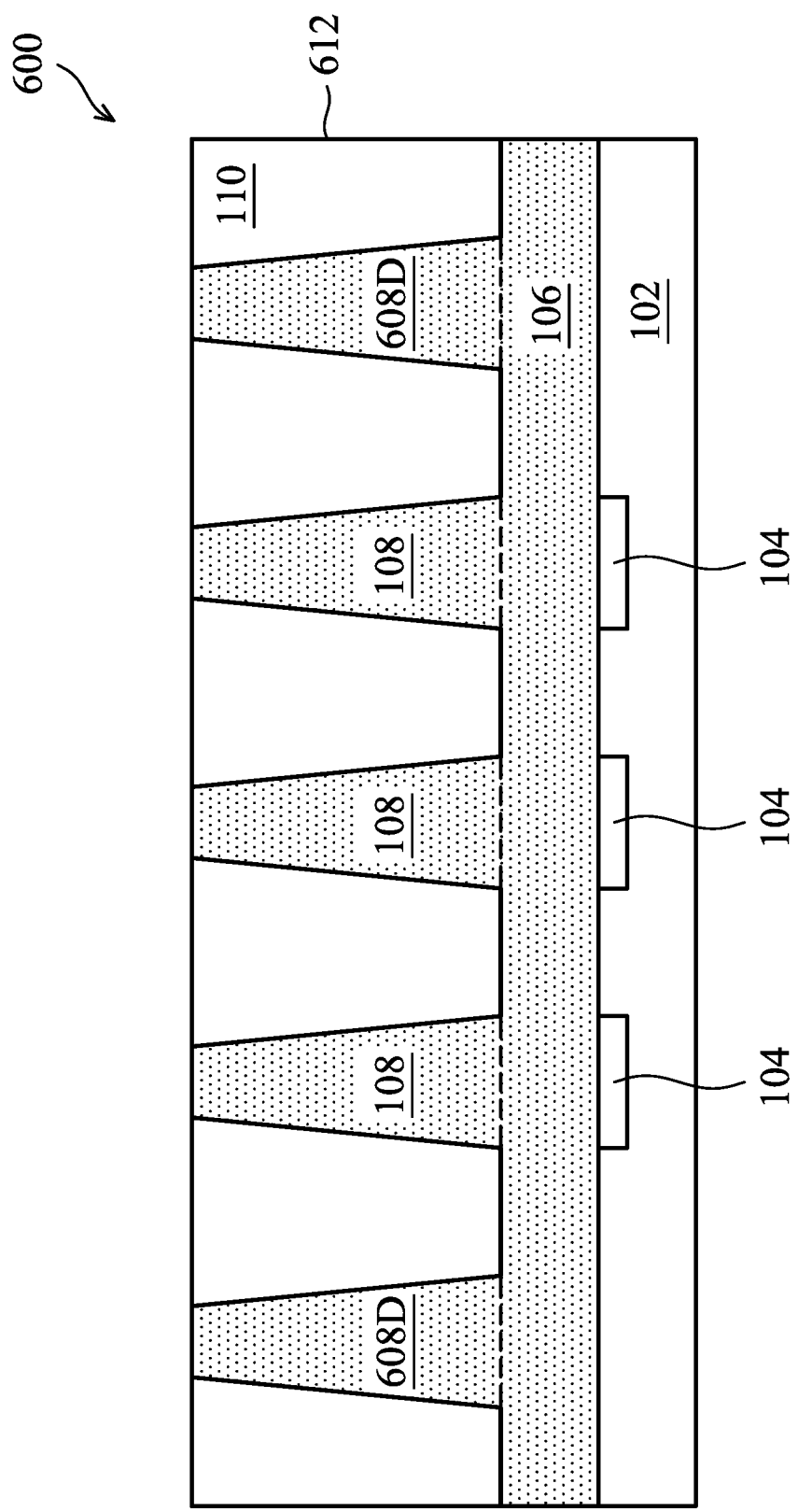
FIG. 9 is a cross-sectional view of an optical sensor in accordance with some other embodiments of the present disclosure.

FIG. 9 is a cross-sectional view of an optical sensor 600 in accordance with some other embodiments of the present disclosure, wherein elements and processes that are the same or similar to those described above are denoted by the same numerals and the description thereof will not be repeated. The difference from the embodiments described above is that a collimating layer 612 further includes dummy transparent pillars 608D which pass through the light-shielding layer 110 and are located over the substrate 102 in a peripheral region of the collimating layer 612, as shown in FIG. 9. In some embodiments, the dummy transparent pillars 608D do not correspond to any underlying pixels 104, as shown in FIG. 9.

In some embodiments, the dummy transparent pillars 608D may be formed over the peripheral region of the substrate 102 while the transparent pillars 108 are formed. The material of the dummy transparent pillars 608D may be the same as that of the transparent pillars 108. As a result, as shown in FIG. 9, the process can save time and money.

In some embodiments, the pixels 104 may be arranged in an array, and thus the transparent pillars 108 may also be arranged in an array. The transparent pillars 108 disposed at the array edge may be deformed and collapsed due to the cohesive force between the molecules of transparent material or subsequent processes. By disposing the dummy transparent pillars 608D at the array edge of the transparent pillars 108 to serve as a stress buffer and provide physical support, the array structure of the transparent pillars 108 can be strengthened to prevent the transparent pillars 108 at the array edge from being deformed and collapsed and maintain the uniformity of the transparent pillars 108, thereby increasing the yield.

It is worth noting that the shape and the size of the dummy transparent pillars in FIG. 9 is merely an example, and the present disclosure is not limited thereto. In the embodiments of the present disclosure, the dummy transparent pillars may be any number, arranged in any way, any shape, any size, and any proportional relationship, depending on process and design demands.

In the embodiments as shown in FIG. 9, the total aspect ratio of the transparent portion of the collimating layer of the optical sensor can be increased by forming the transparent layer and transparent pillars of the transparent portion respectively. Moreover, the array structure of the transparent pillars can be further strengthened by disposing the dummy transparent pillars at the array edge of the transparent pillars to prevent the deformation and collapse of the transparent pillars due to their heights being too high. Furthermore, the incident light from above can be vertically incident to the transparent layer by modifying the shape and the size of the transparent pillars in the cross-sectional view to prevent the light from escaping to areas outside the pixels, thereby improving the collimating effect and increasing the yield.

In summary, the embodiments of the present disclosure provide an optical sensor. The total aspect ratio of the transparent portion of the collimating layer of the optical sensor can be increased by forming the transparent layer and transparent pillars of the transparent portion respectively. Moreover, the formation of gaps between the transparent pillars and the light-shielding layer can be prevented and the incident light can be vertically incident to the transparent layer by freely modifying the shape, the size, and the proportional relationship of the transparent pillars. Moreover, the noise of the optical signal can be decreased by forming the bottom light-shielding layer over the substrate between the pixels. Moreover, the array structure of the transparent pillars can be further strengthened by disposing the dummy transparent pillars around the transparent pillars to prevent the deformation and collapse of the transparent pillars due to their heights being too high, thereby improving the collimating effect and increasing the yield.

It should be worth noting that although the embodiments of the present disclosure illustrated herein are applied to a fingerprint recognition sensor, the embodiments of the present disclosure may also be applied to other sensors having different resolution, such as a biosensor. In addition, the sensed light may be visible or invisible (e.g., infrared or ultraviolet) but may not be limited to the sensors sensing fingerprint patterns.

It should be noted that although the advantages and benefits of some embodiments of the present disclosure are described above, not all of the embodiments is required to achieve all of the advantages and benefits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
   pixels disposed in a substrate; and
   a light collimating layer disposed on the substrate, comprising:
   a transparent layer blanketly disposed on the substrate, covering the pixels and a region between the pixels;
   a light-shielding layer disposed over the transparent layer;
   transparent pillars through the light-shielding layer, correspondingly disposed on the pixels, and
   a bottom light-shielding layer disposed below the transparent layer and over the substrate between the pixels, wherein a material of the bottom light-shielding layer is different from a material of the light-shielding layer,
   wherein a bottom surface of the light-shielding layer fully covers a portion of the transparent layer below which the pixels are not disposed.

2. The optical sensor as claimed in claim 1, wherein each of the transparent pillars has a bottom surface and a top surface; the bottom surface of each transparent pillar has an area; the top surface of each transparent pillar has an area; and the area of the bottom surfaces of the transparent pillars is not equal to the area of the top surfaces of the transparent pillars.

3. The optical sensor as claimed in claim 1, wherein each of the transparent pillars has a bottom surface and a top surface; the bottom surface of each transparent pillar has an area; the top surface of each transparent pillar has an area; and the area of the bottom surfaces of the transparent pillars is equal to the area of the top surfaces of the transparent pillars.

4. The optical sensor as claimed in claim 1, wherein each of the transparent pillars has a sidewall and a bottom surface which is not perpendicular to the sidewall.

5. The optical sensor as claimed in claim 1, wherein each of the transparent pillars has a sidewall and a bottom surface which is perpendicular to the sidewall.

6. The optical sensor as claimed in claim 1, wherein a ratio of a total height of the transparent pillars and the transparent layer to an average width of the transparent pillars is between 1 and 50.

7. The optical sensor as claimed in claim 1, wherein a ratio of a diameter of the transparent pillars to a height of the transparent layer is between 1 and 50.

8. The optical sensor as claimed in claim 1, further comprising:
a dummy transparent pillar penetrating through the light-shielding layer, disposed over the substrate in a peripheral region of the light collimating layer,
wherein the dummy transparent pillar does not correspond to any of the pixels.

9. The optical sensor as claimed in claim 1, wherein the transparent pillars comprise a top portion, a bottom portion and a center portion connecting the top portion and the bottom portion, and a width of the top portion and a width of the bottom portion are greater than a width of the center portion.

10. The optical sensor as claimed in claim 1, wherein a sidewall of the transparent pillars has a double concave shape, hyperbolic shape, curvature shape or half-sphere-like shape in a cross-sectional view.

11. A method for forming an optical sensor, comprising:
forming pixels in a substrate; and
forming a light collimating layer on the substrate, wherein forming the light collimating layer comprises:
blanketly forming a transparent layer on the substrate, covering the pixels and a region between the pixels;
forming transparent pillars on the transparent layer, wherein the transparent pillars are correspondingly disposed on the pixels;
forming a light-shielding layer between the transparent pillars;
forming a bottom light-shielding layer below the transparent layer and over the substrate between the pixels, wherein a material of the bottom light-shielding layer is different from a material of the light-shielding layer; and
planarizing upper surfaces of the transparent pillars and the light-shielding layer,
wherein a bottom surface of the light-shielding layer fully covers a portion of the transparent layer below which the pixels are not disposed.

12. The method as claimed in claim 11, wherein each of the transparent pillars has a bottom surface and a top surface; the bottom surface of each transparent pillar has an area; the top surface of each transparent pillar has an area; and the area of the bottom surfaces of the transparent pillars is not equal to the area of the top surfaces of the transparent pillars.

13. The method as claimed in claim 11, wherein each of the transparent pillars has a bottom surface and a top surface; the bottom surface of each transparent pillar has an area; the top surface of each transparent pillar has an area; and the area of the bottom surfaces of the transparent pillars is equal to the area of the top surfaces of the transparent pillars.

14. The method as claimed in claim 11, wherein a ratio of a total height of the transparent pillars and the transparent layer to an average width of the transparent pillars is between 1 and 50.

15. The method as claimed in claim 11, wherein a ratio of a diameter of the transparent pillars to a height of the transparent layer is between 1 and 50.

16. The method as claimed in claim 11, further comprising:
forming a dummy transparent pillar in a peripheral region of the light collimating layer, wherein the dummy transparent pillar does not correspond to one of the pixels.

* * * * *